(12) United States Patent
Yang et al.

(10) Patent No.: US 9,762,268 B2
(45) Date of Patent: Sep. 12, 2017

(54) WIRELESS TRANSCEIVER (71) Applicant: Huawei Technologies Co., Ltd., Shenzhen (CN)

(72) Inventors: Ganghua Yang, Boulogne-Billancourt (FR); Hongqiang Bao, Boulogne-Billancourt (FR)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/014,851

(22) Filed: Feb. 3, 2016

(65) Prior Publication Data
US 2016/0156375 A1 Jun. 2, 2016

Related U.S. Application Data (63) Continuation of application No. PCT/CN2013/090243, filed on Dec. 23, 2013.

(51) Int. Cl.
*H04L 25/49* (2006.01)
*H04B 1/04* (2006.01)
(Continued)

(52) U.S. Cl.
CPC ......... *H04B 1/0475* (2013.01); *H04B 1/0007* (2013.01); *H04B 1/04* (2013.01); *H04L 27/368* (2013.01); *H04B 2001/0425* (2013.01)

(58) Field of Classification Search
CPC .............................. H03F 1/3247; H04L 27/368
(Continued)

(56) References Cited

U.S. PATENT DOCUMENTS 8,064,372 B2 * 11/2011 Kim ................... H04B 7/15557
370/279
2001/0002822 A1 * 6/2001 Watters ..................... G01S 5/14
342/357.64
(Continued)

FOREIGN PATENT DOCUMENTS

CN 1988522 A 6/2007
CN 101355537 A 1/2009
(Continued)

OTHER PUBLICATIONS

Chung, S.W. et al., "Digital Predistortion Using Quadrature ΔΣ Modulation with Fast Adaptation for WLAN Power Amplifiers," Microsystems Technology Laboratories, Massachusetts Institute of Technology, Cambridge, MA 02139, USA, 2011, 4 pages.
(Continued)

*Primary Examiner* — Khai Tran
(74) *Attorney, Agent, or Firm* — Slater Matsil, LLP (57) ABSTRACT

Embodiments of the present disclosure disclose a wireless transceiver. The wireless transceiver includes a second control switch, and the second control switch may selectively connect a signal output end of a coupler or a signal output end of a low noise amplifier LNA to a signal input end of the down converter. Therefore, when the signal output end of the coupler is connected to the down converter, the coupler, the down converter, and the analog-to-digital converter ADC form an observer; when the second control switch connects the signal output end of the low noise amplifier LNA to the signal input end of the down converter, a transceiver antenna, the low noise amplifier LNA, the down converter, and the analog-to-digital converter ADC form a receiver. Therefore, the embodiments of the present disclosure can greatly save hardware costs of a system for implementing an observer circuit.

20 Claims, 3 Drawing Sheets (51) Int. Cl.
*H04B 1/00* (2006.01)
*H04L 27/36* (2006.01)

(58) Field of Classification Search
USPC .................................. 375/297, 296; 330/149
See application file for complete search history.

(56) References Cited

U.S. PATENT DOCUMENTS

| | | |
|---|---|---|
| 2005/0243946 A1 | 11/2005 | Chung et al. |
| 2008/0049868 A1 | 2/2008 | Brobston |
| 2009/0323582 A1* | 12/2009 | Proctor, Jr. ............. H04B 7/04 370/315 |
| 2010/0253426 A1 | 10/2010 | Su et al. |
| 2013/0100991 A1 | 4/2013 | Woo |
| 2014/0050282 A1* | 2/2014 | Watanabe ............. H03F 1/3247 375/296 |
| 2014/0064339 A1* | 3/2014 | Kim ..................... H04L 5/0051 375/219 |
| 2016/0234876 A1* | 8/2016 | Burra ................. H04W 28/0284 |

FOREIGN PATENT DOCUMENTS

| | | |
|---|---|---|
| CN | 101459636 A | 6/2009 |
| CN | 101621304 A | 1/2010 |

OTHER PUBLICATIONS

Shen, S. et al., "Simulation of Digital Pre-distortion System Based on MATLAB and ADS," Matlab ADS, System Simulation Technology, vol. 7 No. 4, Nov. 2011, 12 pages.

* cited by examiner

WIRELESS TRANSCEIVER

This application is a continuation of International Application No. PCT/CN2013/090243, filed on Dec. 23, 2013, which is hereby incorporated by reference in its entirety.

TECHNICAL FIELD

The present disclosure relates to the field of communications technologies, and in particular, to a wireless transceiver.

BACKGROUND

In the pre-distortion technology, a digital pre-distorter (DPD) whose property (amplitude and phase) is opposite to that of a transformation function is cascaded before a nonlinear power amplifier (PA), to change in advance an input signal to be opposite to the property of the power amplifier, so that input and output of the PA presents an overall linear relationship. Because the nonlinear property of the power amplifier changes in actual environment due to factors such as temperature, humidity, a supply voltage, component aging, and channel switching, in order to ensure stable linear output of a system, the digital pre-distorter is required to adjust automatically according to a change of the property of the power amplifier.

Figure 1:
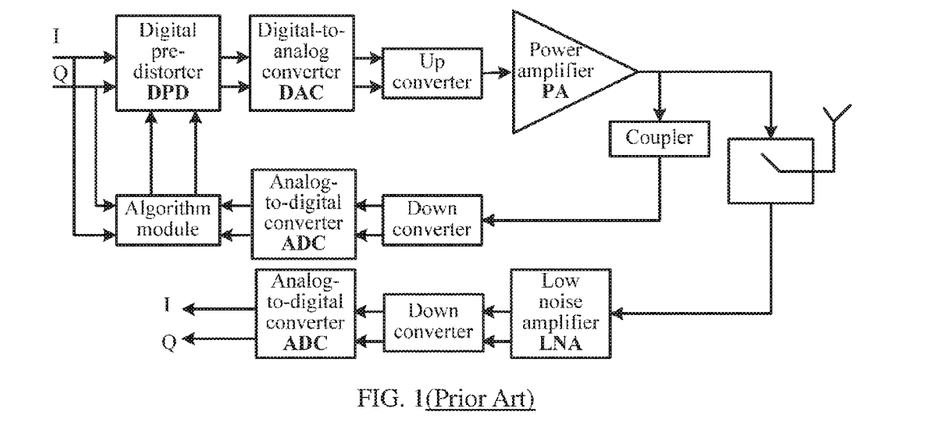
FIG. 1 is a schematic structural diagram of a wireless transceiver in the prior art.

As shown in FIG. 1, in the prior art, in order to dynamically adjust, by using an algorithm, distortion caused by a nonlinear amplifier PA, some circuit adjustment circuits are added, which are called observing circuits (including a coupler, a down converter, an analog-to-digital converter (ADC), and an algorithm module that are connected in sequence in FIG. 1). In FIG. 1, after obtaining a distorted signal of the PA, the coupler converts the distorted signal to a base band signal by using the down converter; the analog-to-digital converter (ADC) performs analog-to-digital conversion; and the algorithm module performs adjustment by using a specific algorithm, so as to ensure that a signal subsequently input to a DPD is linearly output after being processed by the PA.

As can be known from FIG. 1, in the foregoing solution of the prior art, in order to implement the pre-distortion technology, some circuits (observers) need to be added in an original time division duplexing (TDD) transceiver system, which doubtlessly increases hardware costs of the system.

SUMMARY

Embodiments of the present disclosure provide a wireless transceiver, so as to resolve a problem in the prior art that because an observer is added to perform pre-distortion processing, hardware costs are increased.

A first aspect of the embodiments of the present disclosure provides a wireless transceiver, including:

a digital pre-distorter DPD (11), a digital-to-analog converter DAC (12), an up converter (13), a power amplifier PA (14), a first control switch (30), a transceiver antenna (40), a coupler (50), a low noise amplifier LNA (21), a second control switch (60), a down converter (22), and an analog-to-digital converter ADC (23), where the digital pre-distorter DPD (11), the digital-to-analog converter DAC (12), the up converter (13), the power amplifier PA (14), and the coupler (50) are connected in sequence;

the first control switch (30) selectively connects a signal output end of the power amplifier PA (14) or a signal input end of the low noise amplifier LNA (21) to the transceiver antenna (40);

the second control switch (60) selectively connects a signal output end of the coupler (50) or a signal output end of the low noise amplifier LNA (21) to a signal input end of the down converter (22); and a signal output end of the down converter (22) is connected to a signal input end of the analog-to-digital converter ADC (23).

In a first possible implementation manner of the first aspect, the digital pre-distorter DPD (11) includes an algorithm module (70), where the algorithm module is configured to obtain a coefficient of a pre-distortion model according to an input original signal and a signal that is output by a first signal output end of the analog-to-digital converter ADC (23).

In another possible implementation manner of the first aspect, the wireless transceiver includes an algorithm module (70), where a first input end of the algorithm module (70) is connected to a first signal output end of the analog-to-digital converter ADC (23), a signal that is input to a second input end of the algorithm module (70) is an original signal, an output end of the algorithm module (70) is connected to an input end of the digital pre-distorter DPD (11), and the algorithm module is configured to obtain a coefficient of a pre-distortion model according to the input original signal and a signal that is output by the analog-to-digital converter ADC (23).

It can be seen from the above that the wireless transceiver of the embodiments of the present disclosure includes a second control switch, and the second control switch may selectively connect a signal output end of the coupler or a signal output end of the low noise amplifier LNA to a signal input end of the down converter. Therefore, when the signal output end of the coupler is connected to the down converter, the coupler, the down converter, and the analog-to-digital converter ADC form an observer; when the second control switch connects the signal output end of the low noise amplifier LNA to the signal input end of the down converter, the transceiver antenna, the low noise amplifier LNA, the down converter, and the analog-to-digital converter ADC form a receiver. Therefore, in the embodiments of the present disclosure, the existing down converter and digital-to-analog converter ADC of the wireless transceiver may be reused by using the second control switch, to implement a function of the observer, which implements effective compatibility between the observer and the receiver, and in comparison with a case in which a new circuit is added, can greatly save hardware costs of a system for implementing an observer circuit.

BRIEF DESCRIPTION OF THE DRAWINGS

To describe the technical solutions in the embodiments of the present disclosure or in the prior art more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION OF ILLUSTRATIVE EMBODIMENTS

The following clearly describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 2:
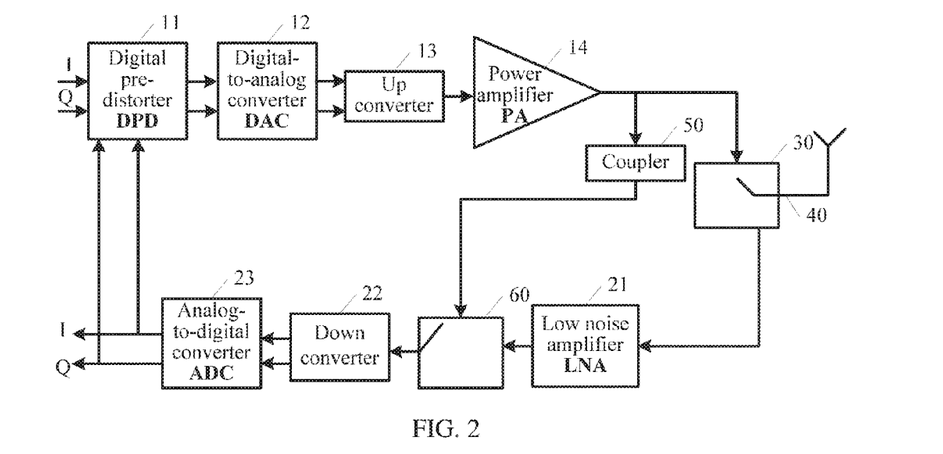
FIG. 2 is a schematic structural diagram of an embodiment of a wireless transceiver according to the present disclosure.

FIG. 2 is a schematic structural diagram of an embodiment of a wireless transceiver according to the present disclosure. As shown in FIG. 2, the wireless transceiver may include:

a digital pre-distorter DPD 11, a digital-to-analog converter DAC 12, an up converter 13, a power amplifier PA 14, a first control switch 30, a transceiver antenna 40, a coupler 50, a low noise amplifier LNA 21, a second control switch 60, a down converter 22, and an analog-to-digital converter ADC 23, where the digital pre-distorter DPD 11, the digital-to-analog converter DAC 12, the up converter 13, the power amplifier PA 14, and the coupler 50 are connected in sequence. Sequential connection in this embodiment of the present disclosure refers that an output end of a previous component is connected to an input end of a next component, and so forth. The first control switch 30 selectively connects a signal output end of the power amplifier PA 14 or a signal input end of the low noise amplifier LNA 21 to the transceiver antenna 40; the second control switch 60 selectively connects a signal output end of the coupler 50 or a signal output end of the low noise amplifier LNA 21 to a signal input end of the down converter 22; a signal output end of the down converter 22 is connected to a signal input end of the analog-to-digital converter ADC 23; and a signal output end of the analog-to-digital converter ADC 23 is connected to a signal input end of the digital pre-distorter DPD 11.

The first control switch 30 may selectively connect the signal output end of the power amplifier PA 14 or the signal input end of the low noise amplifier LNA 21 to the transceiver antenna 40 in a time division multiplexing manner; and the second control switch 60 selectively connects the signal output end of the coupler 50 or the signal output end of the low noise amplifier LNA 21 to the signal input end of the down converter 22 in a time division multiplexing manner.

When the first control switch 30 is closed so that the signal output end of the power amplifier PA 14 is connected to the transceiver antenna 40, the second control switch 60 is closed so that the signal output end of the coupler 50 is connected to the down converter 22; and when the first control switch 30 is closed so that the signal input end of the low noise amplifier LNA 21 is connected to the transceiver antenna 40, the second control switch 60 is closed so that the signal output end of the low noise amplifier LNA 21 is connected to the signal input end of the down converter 22.

During specific implementation, the wireless transceiver of this embodiment of the present disclosure may be a TDD wireless transceiver. The first control switch 30 and the second control switch 60 may be controlled in a time division manner based on an antenna switch, so that the first control switch 30 may selectively connect the signal output end of the power amplifier PA 14 or the signal input end of the low noise amplifier LNA 21 to the transceiver antenna 40 in a time division multiplexing manner according to a time division multiplexing principle of a system (for example, in TD-LTE, a transmission/reception ratio is 1:1, and 1 ms may be divided into 500 us for transmission and 500 us for reception). For example, the former 500 us is a signal transmission period, and the signal output end of the power amplifier PA 14 is connected to the transceiver antenna 40 by using the first control switch 30; the latter 500 us is a signal reception period, the signal input end of the low noise amplifier LNA 21 is connected to the transceiver antenna 40 by using the first control switch 30.

Specifically, a coefficient of a pre-distortion model may be preset in the digital pre-distorter DPD 11 in this embodiment of the present disclosure. When receiving a signal output by the analog-to-digital converter ADC 23, the digital pre-distorter DPD 11 may implement pre-distortion processing on the input signal according to the preset coefficient of the pre-distortion model, so as to compensate for nonlinear distortion of the power amplifier PA 14.

During specific implementation, in this embodiment, a sampling frequency of the digital-to-analog converter DAC 12 of this embodiment of the present disclosure is K times a base band signal bandwidth, where K is a distortion model order (for example, order three or order five) of the power amplifier PA 14. Under this condition, it can be ensured that no aliasing distortion occurs after a signal passes through the nonlinear component PA 14. A frequency of the analog-to-digital converter ADC 23 in this embodiment of the present disclosure may be the same as a frequency of the analog-to-digital converter DAC 12. In this case, a received signal and a feedback signal that is sent to the DPD can be restored without distortion in a receiver circuit.

In this embodiment of the present disclosure, a second control switch 60 may selectively connect a signal output end of a coupler 50 or a signal output end of a low noise amplifier LNA 21 to a signal input end of a down converter 22; when the signal output end of the coupler 50 is connected to the down converter 22, the coupler 50, the down converter 22, and an analog-to-digital converter ADC 23 form an observer; when the second control switch 60 connects the signal output end of the low noise amplifier LNA 21 to the signal input end of the down converter 22, a transceiver antenna 40, the low noise amplifier LNA 21, the down converter 22, and the analog-to-digital converter ADC 23 form a receiver. Therefore, in this embodiment of the present disclosure, the existing down converter and digital-to-analog converter ADC of the wireless transceiver may be reused by using the second control switch, to implement a function of the observer, which implements effective compatibility between the observer and the receiver, and in comparison with the prior art in which a new observer circuit is added, can greatly save hardware costs of a system for implementing an observer circuit.

Figure 3:
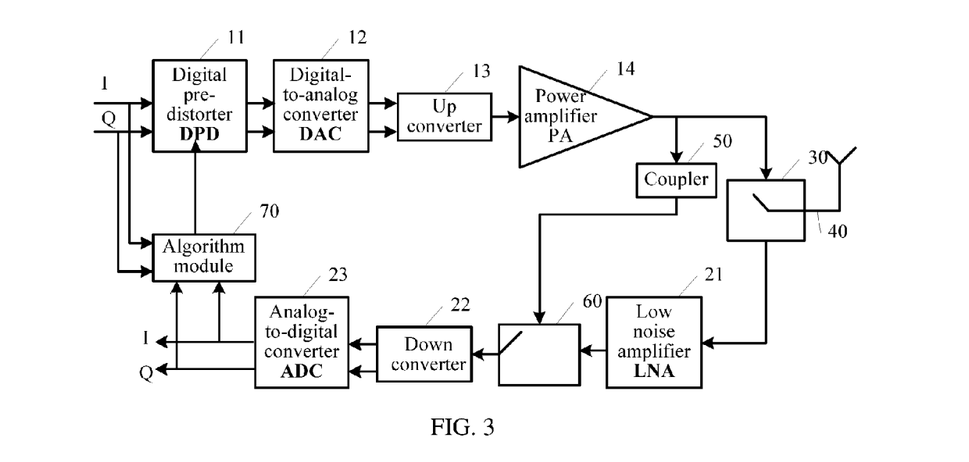
FIG. 3 is a schematic structural diagram of another embodiment of a wireless transceiver according to the present disclosure.

FIG. 3 is a schematic structural diagram of another embodiment of a wireless transceiver according to the present disclosure. A difference from the previous embodiment lies in that: in this embodiment, an algorithm module 70 is added after an analog-to-digital converter ADC 23, where the algorithm module 70 may be integrated in a digital pre-distorter DPD 11, or may be an independent module. When the algorithm module 70 is an independent module, the algorithm module 70 may be a DSP (Digital Signal Processing, digital signal processing) chip, an FPGA (Field-Programmable Gate Array, field-programmable gate array), or the like, which is not limited in this embodiment of the present disclosure herein.

As shown in FIG. 3, using that the algorithm module 70 is an independent module as example, the wireless transceiver includes:

the digital pre-distorter DPD 11, a digital-to-analog converter DAC 12, an up converter 13, a power amplifier PA 14, a first control switch 30, a transceiver antenna 40, a coupler 50, a low noise amplifier LNA 21, a second control switch 60, a down converter 22, the analog-to-digital converter ADC 23, and the algorithm module 70, where the digital pre-distorter DPD 11, the digital-to-analog converter DAC 12, the up converter 13, the power amplifier PA 14, and the coupler 50 are connected in sequence; the first control switch 30 selectively connects a signal output end of the power amplifier PA 14 or a signal input end of the low noise amplifier LNA 21 to the transceiver antenna 40; the second control switch 60 selectively connects a signal output end of the coupler 50 or a signal output end of the low noise amplifier LNA 21 to a signal input end of the down converter 22; a signal output end of the down converter 22 is connected to a signal input end of the analog-to-digital converter ADC 23; a first input end of the algorithm module 70 is connected to a first signal output end of the analog-to-digital converter ADC 23; a signal input to a second input end of the algorithm module 70 is an original signal; an output end of the algorithm module 70 is connected to an input end of the digital pre-distorter DPD 11; and the algorithm module 70 is configured to obtain a coefficient of a pre-distortion model according to the input original signal and a signal that is output by the first signal output end of the analog-to-digital converter ADC 23.

Optionally, when integrated in the digital pre-distorter DPD 11, the algorithm module 70 is configured to obtain the coefficient of the pre-distortion model according to the input original signal and the signal that is output by the first signal output end of the analog-to-digital converter ADC 23.

The pre-distortion processing model of the digital pre-distorter 11 in this embodiment of the present disclosure is related to a model of the power amplifier PA 14, and may be represented by using a polynomial series with a memory effect, such as a simplified model of a Volterra series. This embodiment of the present disclosure does not limit the pre-distortion processing model of the digital pre-distorter 11. The coefficient, output by the algorithm module 70, of the pre-distortion model may be obtained by solving a difference between two signals. For example, the coefficient is obtained by comparing the original input signal with a signal processed by the power amplifier PA 14, the down converter 22, and the analog-to-digital converter ADC 23.

When the first control switch 30 connects the signal output end of the power amplifier PA 14 to the transceiver antenna 40, and the second control switch 60 connects the signal output end of the coupler 50 to the down converter 22, the digital pre-distorter DPD 11, the digital-to-analog converter DAC 12, the up converter 13, the power amplifier PA 14, and the transceiver antenna 40 form a transmitter, and the coupler 50, the down converter 22, the analog-to-digital converter ADC 23, and the algorithm module 70 form an observer.

When the first control switch 30 connects the signal input end of the low noise amplifier LNA 21 to the transceiver antenna 40, and the second control switch 60 connects the signal output end of the low noise amplifier LNA 21 to the signal input end of the down converter 22, the transceiver antenna 40, the low noise amplifier LNA 21, the down converter 22, and the analog-to-digital converter ADC 23 form a receiver, where a second signal output end of the analog-to-digital converter ADC 23 is configured to output a received signal from the transceiver antenna 40.

In this embodiment of the present disclosure, an existing down converter and digital-to-analog converter ADC of a wireless transceiver are reused by using a second control switch, to implement a function of an observer, which implements effective compatibility between the observer and a receiver, and in comparison with a case in which a new circuit is added, can greatly save hardware costs of a system for implementing an observer circuit.

Figure 4:
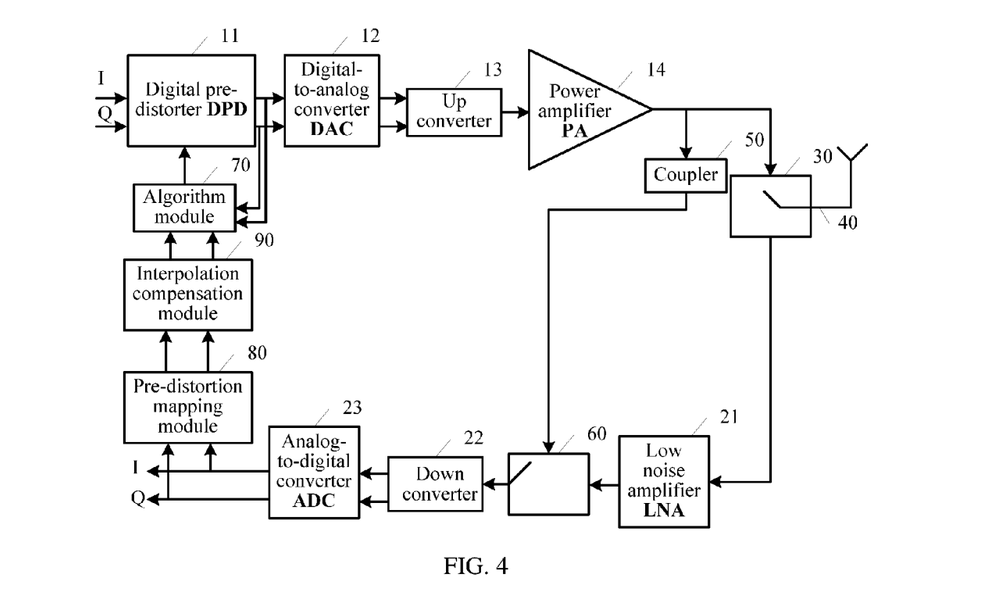
FIG. 4 is a schematic structural diagram of still another embodiment of a wireless transceiver according to the present disclosure.

FIG. 4 is a schematic structural diagram of still another embodiment of a wireless transceiver according to the present disclosure. As shown in FIG. 4, based on the embodiment of FIG. 3, in this embodiment, an interpolation compensation module 90 and a pre-distortion mapping module 80 are connected between the algorithm module 70 and the analog-to-digital converter ADC 23, where the pre-distortion mapping module 80 is configured to perform pre-distortion processing on a signal that is output by a first signal output end of the analog-to-digital converter ADC, to compensate for distortion brought by the power amplifier PA; and the interpolation compensation module 90 is configured to perform interpolation compensation on a signal that has been processed by the pre-distortion mapping module 80. During specific implementation, the interpolation compensation module 90 may perform interpolation compensation, in an interpolation manner, on a signal that is output by the ADC 23. Specifically, the interpolation compensation module 90 may perform interpolation compensation, by using a bi-linear interpolation algorithm, a higher-order spline interpolation algorithm, or the like, on the signal that is output by the ADC 23, which is not limited in this embodiment of the present disclosure herein.

A difference between FIG. 4 and FIG. 3 lies in that: a second signal input end of the algorithm module 70 in FIG. 4 is connected to a signal output end of the digital pre-distorter DPD, that is, one of the input signal of the algorithm module in the embodiment of FIG. 4 is a signal processed by the digital pre-distorter DPD, while one of the input signal of the algorithm module in the embodiment of FIG. 3 is an original signal that is not processed by the digital pre-distorter DPD.

Therefore, in this embodiment of the present disclosure, the interpolation compensation module 90 may perform sampling point supplementing on a signal. Therefore, a sampling frequency of the analog-to-digital converter ADC 23 can be reduced, for example, the lowest sampling frequency is two times that of a base band signal bandwidth. In the prior art, a signal processed by an ADC is a distorted signal; because of spectrum spreading, if only order three and order five cross-modulation distortion is considered, a spectrum bandwidth may be expanded to five times an original signal bandwidth; usually, a very high sampling frequency is used to perform sampling on a distortion feedback signal, which has a very high requirement on a component. In this embodiment of the present disclosure, after the pre-distortion mapping module 80 and the interpolation compensation module 90 are connected after the ADC 23, pre-distortion processing and interpolation compensation can be performed on the signal output by the ADC 23. In this case, a sampling frequency of the ADC 23 can be reduced, and a lowest sampling frequency may be two times that of the base band signal bandwidth.

Therefore, in this embodiment of the present disclosure, when the ADC 23 is reused, requirements of a system on the sampling frequency of the ADC 23 can also be reduced, and ADC hardware costs can be reduced.

Figure 5:
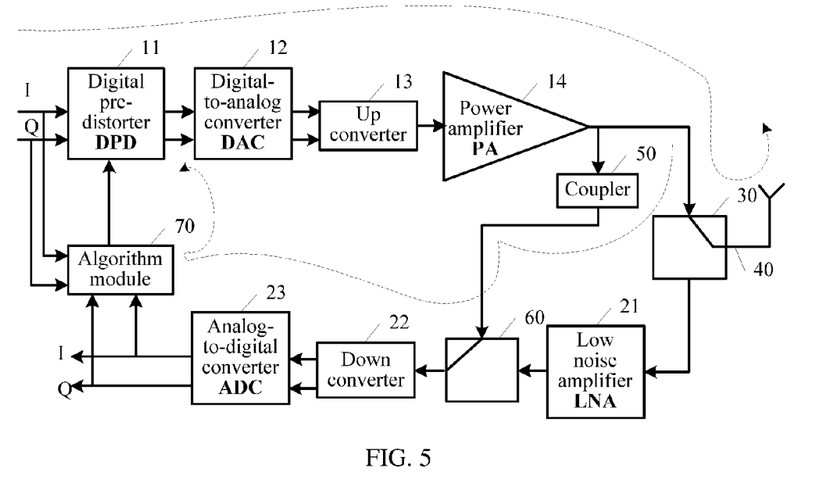
FIG. 5 is a schematic structural diagram of a wireless transceiver when a transmitter is working according to the present disclosure.
Figure 6:
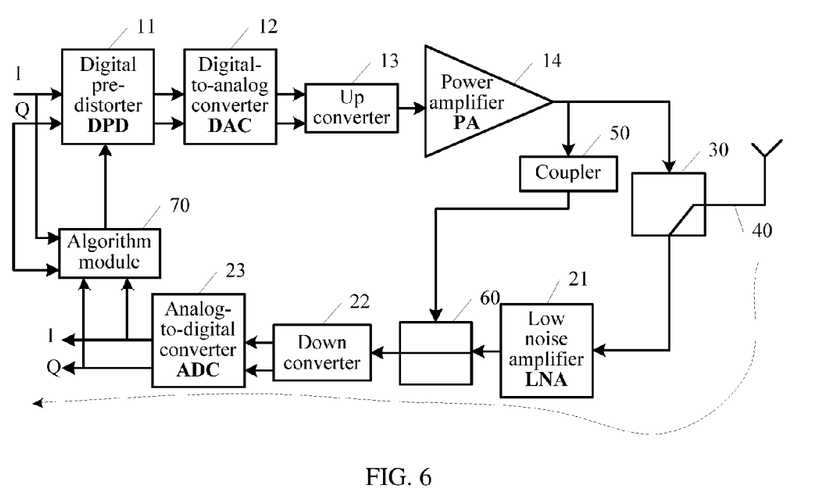
FIG. 6 is a schematic structural diagram of a wireless transceiver when a receiver is working according to the present disclosure.

The following describes a signal direction in this embodiment of the present disclosure by using the structure embodiment of FIG. 3 with reference to FIG. 5 and FIG. 6. Specifically, as shown in FIG. 5, in this embodiment of the present disclosure, when a transmitter of the wireless transceiver is working, a switch contact of the first control switch 30 is connected to the signal output end of the power amplifier PA 14, so that the power amplifier PA 14 is connected to the transceiver antenna 40; and a switch contact of the second control switch 60 is connected to the signal output end of the coupler 50, so that the coupler 50 is connected to the down converter. In this case, the digital pre-distorter DPD 11, the digital-to-analog converter DAC 12, the up converter 13, the power amplifier PA 14, and the transceiver antenna 40 may form a transmitter; and the coupler 50, the down converter 22, the analog-to-digital converter ADC 23, and the algorithm module 70 may form an observer (where the down converter 22 and the analog-to-digital converter ADC 23 are inherent receiver parts of the TDD wireless transceiver). It can be known from FIG. 5 that a signal flow direction of the whole system in this case is as follows (referring to a direction of a dashed arrow in FIG. 5):

a transmitted digital base band signal (including an inphase component I signal and a quadrature component Q signal) is input to the digital pre-distorter DPD 11, corrected by the DPD 11, and then converted by the DAC 12 into an analog signal. The analog signal becomes a high-frequency signal after undergoing carrier modulation performed by the up converter 13; and the high-frequency signal becomes a high-power signal after being processed by the power amplifier PA 14; and then, the high-power signal is transmitted by the transceiver antenna 40. Because a signal becomes a high-power signal after being amplified by the PA, power needs to be reduced when the observer is working, where to implement this function, the coupler performs signal attenuation; a lower-power signal obtained after the attenuation passes through the second control switch to the down converter 22 for underclocking, and is then converted by the ADC 23 into a digital base band signal; and the digital base band signal is fed back to the algorithm module 70 through the first signal output end of the analog-to-digital converter ADC; the algorithm module 70 acquires a coefficient of a pre-distortion model according to the feedback signal and the input signal, that is, calculates a specific distortion degree, to form an adjustment model for the input signal, and controls the DPD 11 module to perform specific adjustment on the input signal.

Further, as shown in FIG. 6, in this embodiment of the present disclosure, when the receiver of the wireless transceiver is working, the switch contact of the first control switch 30 is connected to the signal input end of the low noise amplifier LNA 21, so that the signal input end of the low noise amplifier LNA 21 is connected to the transceiver antenna 40; the switch contact of the second control switch 60 is connected to the signal output end of the low noise amplifier LNA 21, so that the signal output end of the low noise amplifier LNA 21 is connected to the signal input end of the down converter 22. In this case, the transceiver antenna 40, the low noise amplifier LNA 21, the down converter 22, and the analog-to-digital converter ADC 23 form a receiver. It can be known from FIG. 6 that a signal flow direction of the whole system in this case is as follows (referring to a direction of a dashed arrow in FIG. 6):

a received signal becomes a high-power signal after being processed by the low noise amplifier LNA 21; the high-power signal becomes a low-frequency base band analog signal after being demodulated by the down converter 22; the low-frequency base band analog signal is converted by the analog-to-digital converter ADC 23 into a base band digital signal, and then the second signal output end of the analog-to-digital converter ADC 23 outputs the received signal from the transceiver antenna; and performing receiving.

It can be known by comparing FIG. 5 with FIG. 6 that in this embodiment of the present disclosure, a property of time division multiplexing of a TDD system during reception and transmission is used. When a transmitter of the system is working, a down converter and an ADC module of a receiver of the system are reused to implement a function of an observer of the whole system; when the receiver of the system is working, the down converter and the ADC module of the receiver are reused as functional modules of the receiver. Therefore, in this embodiment of the present disclosure, the functional modules of the receiver are reused to implement the observer, which, in comparison with a solution in the prior art in which a new observer circuit needs to be added, can greatly save hardware costs of the system for implementing an observer circuit.

The wireless transceiver of the embodiments of the present disclosure may be a base station, such as a macro base station or a micro base station. A structure and a working principle thereof are described in related descriptions of FIG. 2 to FIG. 6, and details are not described herein again. In addition, alternatively, the wireless transceiver of the embodiments of the present disclosure may be an access point AP in a WiFi system, or may be a mobile terminal, such as a mobile phone or an in-vehicle terminal.

In this specification, specific examples are used to describe the principle and implementation manners of the present disclosure, and the description of the embodiments is only intended to help understand the method and core idea of the present disclosure. In addition, a person of ordinary skill in the art may, based on the idea of the present disclosure, make modifications with respect to the specific implementation manners and the application scope. Therefore, the content of this specification shall not be construed as a limitation to the present disclosure.

What is claimed is:
1. A wireless transceiver, comprising:
a digital pre-distorter;
a digital-to-analog converter;
an up converter;
a power amplifier;
a first control switch;
a transceiver antenna;
a coupler;
a low noise amplifier;
a second control switch;
a down converter; and
an analog-to-digital converter;

wherein the digital pre-distorter, the digital-to-analog converter, the up converter, the power amplifier, and the coupler are connected in sequence;

wherein the first control switch selectively connects one of a signal output end of the power amplifier or a signal input end of the low noise amplifier to the transceiver antenna;

wherein the second control switch selectively connects one of a signal output end of the coupler or a signal output end of the low noise amplifier to a signal input end of the down converter; and wherein a signal output end of the down converter is connected to a signal input end of the analog-to-digital converter.

2. The wireless transceiver according to claim 1, wherein the digital pre-distorter comprises an algorithm module; and wherein the algorithm module is configured to obtain a coefficient of a pre-distortion model according to an input original signal and a signal that is output by a first signal output end of the analog-to-digital converter.

3. The wireless transceiver according to claim 1, wherein the wireless transceiver further comprises an algorithm module;

wherein a first input end of the algorithm module is connected to a first signal output end of the analog-to-digital converter;

wherein a signal that is input to a second input end of the algorithm module is an original signal;

wherein an output end of the algorithm module is connected to an input end of the digital pre-distorter; and wherein the algorithm module is configured to obtain a coefficient of a pre-distortion model according to the input original signal and a signal that is output by the analog-to-digital converter.

4. The wireless transceiver according to claim 2, wherein, when the first control switch connects the signal output end of the power amplifier to the transceiver antenna, and when the second control switch connects the signal output end of the coupler to the down converter, the digital pre-distorter, the digital-to-analog converter, the up converter, the power amplifier, and the transceiver antenna form a transmitter, and the coupler, the down converter, the analog-to-digital converter, and the algorithm module form an observer; and wherein, when the first control switch connects the signal input end of the low noise amplifier to the transceiver antenna, and when the second control switch connects the signal output end of the low noise amplifier to the signal input end of the down converter, the transceiver antenna, the low noise amplifier, the down converter, and the analog-to-digital converter form a receiver; and wherein a second signal output end of the analog-to-digital converter is configured to output a received signal from the transceiver antenna.

5. The wireless transceiver according to claim 1, wherein the wireless transceiver further comprises an algorithm module, a pre-distortion mapping module, and an interpolation compensation module;

wherein a first input end of the algorithm module is connected to a signal output end of the interpolation compensation module;

wherein a second input end of the algorithm module is connected to a signal output end of the digital pre-distorter;

wherein an output end of the algorithm module is connected to an input end of the digital pre-distorter; and wherein the algorithm module is configured to obtain a coefficient of a pre-distortion model according to a signal that has been processed by the digital pre-distorter and a signal that is output by the interpolation compensation module.

6. The wireless transceiver according to claim 5, wherein the pre-distortion mapping module is configured to perform pre-distortion processing on a signal that is output by a first signal output end of the analog-to-digital converter, to compensate for distortion brought by the power amplifier; and wherein the interpolation compensation module is configured to perform interpolation compensation on a signal that has been processed by the pre-distortion mapping module.

7. The wireless transceiver according to claim 1, wherein the first control switch selectively connects one of the signal output end of the power amplifier or the signal input end of the low noise amplifier to the antenna in a time division multiplexing manner; and wherein the second control switch selectively connects one of the signal output end of the coupler or the signal output end of the low noise amplifier to the signal input end of the down converter in a time division multiplexing manner.

8. The wireless transceiver according to claim 1, wherein, when the first control switch is closed so that the signal output end of the power amplifier is connected to the transceiver antenna, the second control switch is closed so that the signal output end of the coupler is connected to the single input end of the down converter; and wherein, when the first control switch is closed so that the signal input end of the low noise amplifier is connected to the transceiver antenna, the second control switch is closed so that the signal output end of the low noise amplifier is connected to the signal input end of the down converter.

9. A mobile terminal, comprising:
a wireless transceiver, comprising:
 a digital pre-distorter;
 a digital-to-analog converter;
 an up converter;
 a power amplifier;
 a first control switch;
 a transceiver antenna;
 a coupler;
 a low noise amplifier;
 a second control switch;
 a down converter; and
 an analog-to-digital converter,
 wherein the digital pre-distorter, the digital-to-analog converter, the up converter, the power amplifier, and the coupler are connected in sequence;
wherein the first control switch selectively connects a signal output end of the power amplifier or a signal input end of the low noise amplifier to the transceiver antenna;
wherein the second control switch selectively connects a signal output end of the coupler or a signal output end of the low noise amplifier to a signal input end of the down converter; and
wherein a signal output end of the down converter is connected to a signal input end of the analog-to-digital converter.

10. The wireless transceiver according to claim 9, wherein the digital pre-distorter comprises an algorithm module; and wherein the algorithm module is configured to obtain a coefficient of a pre-distortion model according to an input original signal and a signal that is output by a first signal output end of the analog-to-digital converter.

11. The wireless transceiver according to claim 9, wherein the wireless transceiver further comprises an algorithm module;
wherein a first input end of the algorithm module is connected to a first signal output end of the analog-to-digital converter;
wherein a signal that is input to a second input end of the algorithm module is an original signal;
wherein an output end of the algorithm module is connected to an input end of the digital pre-distorter; and
wherein the algorithm module is configured to obtain a coefficient of a pre-distortion model according to the input original signal and a signal that is output by the analog-to-digital converter.

12. The wireless transceiver according to claim 9, wherein the wireless transceiver further comprises an algorithm module, a pre-distortion mapping module, and an interpolation compensation module;
wherein a first input end of the algorithm module is connected to a signal output end of the interpolation compensation module;
wherein a second input end of the algorithm module is connected to a signal output end of the digital pre-distorter;
wherein an output end of the algorithm module is connected to an input end of the digital pre-distorter; and
wherein the algorithm module is configured to obtain a coefficient of a pre-distortion model according to a signal that has been processed by the digital pre-distorter and a signal that is output by the interpolation compensation module.

13. A base station, comprising:
a wireless transceiver, comprising:
a digital pre-distorter;
a digital-to-analog converter;
an up converter;
a power amplifier;
a first control switch;
a transceiver antenna;
a coupler;
a low noise amplifier;
a second control switch;
a down converter; and
an analog-to-digital converter;
wherein the digital pre-distorter, the digital-to-analog converter, the up converter, the power amplifier, and the coupler are connected in sequence;
wherein the first control switch selectively connects a signal output end of the power amplifier or a signal input end of the low noise amplifier to the transceiver antenna;
wherein the second control switch selectively connects a signal output end of the coupler or a signal output end of the low noise amplifier to a signal input end of the down converter; and
wherein a signal output end of the down converter is connected to a signal input end of the analog-to-digital converter.

14. The wireless transceiver according to claim 13, wherein the digital pre-distorter comprises an algorithm module; and
wherein the algorithm module is configured to obtain a coefficient of a pre-distortion model according to an input original signal and a signal that is output by a first signal output end of the analog-to-digital converter.

15. The wireless transceiver according to claim 13, wherein the wireless transceiver further comprises an algorithm module;
wherein a first input end of the algorithm module is connected to a first signal output end of the analog-to-digital converter;
wherein a signal that is input to a second input end of the algorithm module is an original signal;
wherein an output end of the algorithm module is connected to an input end of the digital pre-distorter; and
wherein the algorithm module is configured to obtain a coefficient of a pre-distortion model according to the input original signal and a signal that is output by the analog-to-digital converter.

16. The wireless transceiver according to claim 13, wherein the wireless transceiver comprises an algorithm module, a pre-distortion mapping module, and an interpolation compensation module;
wherein a first input end of the algorithm module is connected to a signal output end of the interpolation compensation module;
wherein a second input end of the algorithm module is connected to a signal output end of the digital pre-distorter;
wherein an output end of the algorithm module is connected to an input end of the digital pre-distorter; and
wherein the algorithm module is configured to obtain a coefficient of a pre-distortion model according to a signal that has been processed by the digital pre-distorter and a signal that is output by the interpolation compensation module.

17. An access point of a WiFi system, comprising:
a wireless transceiver comprising:
a digital pre-distorter;
a digital-to-analog converter;
an up converter;
a power amplifier;
a first control switch;
a transceiver antenna;
a coupler;
a low noise amplifier;
a second control switch;
a down converter; and
an analog-to-digital converter;
wherein the digital pre-distorter, the digital-to-analog converter, the up converter, the power amplifier, and the coupler are connected in sequence;
wherein the first control switch selectively connects a signal output end of the power amplifier or a signal input end of the low noise amplifier to the transceiver antenna;
wherein the second control switch selectively connects a signal output end of the coupler or a signal output end of the low noise amplifier to a signal input end of the down converter; and
wherein a signal output end of the down converter is connected to a signal input end of the analog-to-digital converter.

18. The wireless transceiver according to claim 17, wherein the digital pre-distorter comprises an algorithm module; and
wherein the algorithm module is configured to obtain a coefficient of a pre-distortion model according to an input original signal and a signal that is output by a first signal output end of the analog-to-digital converter.

19. The wireless transceiver according to claim 17, wherein the wireless transceiver further comprises an algorithm module;
- wherein a first input end of the algorithm module is connected to a first signal output end of the analog-to-digital converter;
- wherein a signal that is input to a second input end of the algorithm module is an original signal;
- wherein an output end of the algorithm module is connected to an input end of the digital pre-distorter; and
- wherein the algorithm module is configured to obtain a coefficient of a pre-distortion model according to the input original signal and a signal that is output by the analog-to-digital converter.

20. The wireless transceiver according to claim 17, wherein the wireless transceiver further comprises an algorithm module, a pre-distortion mapping module, and an interpolation compensation module;
- wherein a first input end of the algorithm module is connected to a signal output end of the interpolation compensation module;
- wherein a second input end of the algorithm module is connected to a signal output end of the digital pre-distorter;
- wherein an output end of the algorithm module is connected to an input end of the digital pre-distorter; and
- wherein the algorithm module is configured to obtain a coefficient of a pre-distortion model according to a signal that has been processed by the digital pre-distorter and a signal that is output by the interpolation compensation module.

* * * * *